United States Patent
Du et al.

(10) Patent No.: US 7,800,370 B2
(45) Date of Patent: Sep. 21, 2010

(54) RECEIVER COIL ARRAY FOR MAGNETIC RESONANCE IMAGING

(75) Inventors: Jian Jun Du, Shenzhen (CN); Jian Zhong Li, Shenzhen (CN); Jian Hua Pei, Shenzhen (CN); Yao Xing, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 119 days.

(21) Appl. No.: 12/327,996

(22) Filed: Dec. 4, 2008

(65) Prior Publication Data

US 2009/0140740 A1 Jun. 4, 2009

(30) Foreign Application Priority Data

Dec. 4, 2007 (CN) .................. 2007 1 0195528

(51) Int. Cl.
*G01V 3/00* (2006.01)
(52) U.S. Cl. ...................... 324/318; 324/322
(58) Field of Classification Search ......... 324/300–322; 600/407–445
See application file for complete search history.

(56) References Cited

U.S. PATENT DOCUMENTS

| | | | | |
|---|---|---|---|---|
| 5,548,218 A * | 8/1996 | Lu | .............. | 324/318 |
| 5,804,969 A * | 9/1998 | Lian et al. | .............. | 324/318 |
| 6,300,761 B1 * | 10/2001 | Hagen et al. | .............. | 324/318 |
| 6,747,452 B1 * | 6/2004 | Jectic et al. | .............. | 324/311 |
| 6,927,575 B2 * | 8/2005 | Burl et al. | .............. | 324/318 |
| 7,049,819 B2 * | 5/2006 | Chan et al. | .............. | 324/319 |
| 7,248,051 B2 * | 7/2007 | Wang et al. | .............. | 324/322 |
| 7,282,915 B2 * | 10/2007 | Giaquinto et al. | .............. | 324/318 |
| 2006/0006870 A1 * | 1/2006 | Wang et al. | .............. | 324/322 |
| 2008/0174314 A1 * | 7/2008 | Holwell et al. | .............. | 324/318 |
| 2008/0306377 A1 * | 12/2008 | Piron et al. | .............. | 600/422 |
| 2009/0079432 A1 * | 3/2009 | Pinkerton et al. | .............. | 324/322 |

* cited by examiner

*Primary Examiner*—Brij B Shrivastav
(74) *Attorney, Agent, or Firm*—Schiff Hardin LLP

(57) ABSTRACT

A receiver coil array for a magnetic resonance imaging system has an inductive coupling coil incorporated in the middle coil unit of the receiver coil array as its secondary coil, which serves to regulate the frequency and impedance of the middle coil unit. The secondary coil has an output regulation circuit which can output the magnetic resonance signals received by the middle coil unit to increase the number of the coil units in the receiver coil array that receive and output resonance signals while further regulating the frequency and impedance of the middle coil unit. Since this receiver coil array achieves regulation of the frequency and impedance of the middle coil unit and increases the number of the coil units in the receiver coil array that receive and output the resonance signals, it can improve the quality of the signals received by the receiver coil array. Moreover, the design is simple and is easy to achieve.

6 Claims, 4 Drawing Sheets

RECEIVER COIL ARRAY FOR MAGNETIC RESONANCE IMAGING

BACKGROUND OF THE INVENTION

1. Field of the Invention

The present invention relates to magnetic resonance technology, and more particularly, to a receiver coil array used in the magnetic resonance imaging system and a magnetic resonance imaging system comprising said receiver coil array.

2. Description of the Prior Art

In the magnetic resonance imaging system, the receiver coil is used to receive the magnetic resonance signals. A plurality of receiver coils can be arranged in an array and receive magnetic resonance signals through the array to increase the signal-to-noise ratio of the received magnetic resonance signals and better meet the needs of clinical applications. In this case, each of the receiver coils in the receiver coil array can be called a coil unit of the array.

It has become a development trend of the magnetic resonance imaging system to add more coil units in the coil array to improve the quality of the signals received as the needs of clinical application grow. However, coupling may occur among the coil units in the same array thereby changing the frequency (which is determined by pre-tuning) of these coil units to reduce the signal receiving sensitivity of the coils and increase the noise correlation among the coil units, thus reducing the signal-to-noise ratio of the receiver.

In order to solve the aforesaid problems induced by coupling, the prior art adopted the solution of overlapping the coil units of the receiver coil array. FIG. 1 is a schematic diagram showing the structure of a 2×3 receiver coil array using the overlapping coil units. As shown in FIG. 1, taking a 2×3 receiver coil array as an example, each coil unit 10 in the receiver coil array comprises a PCB 11 as the output regulation circuit which is used to regulate the frequency and impedance of the coil unit 10 (that is, the PCB 11 is pre-tuned to determine the frequency and impedance of the coil unit 10 on which the PCB 11 is located), and amplify and output the magnetic resonance signals received by the coil unit 10 on which it is located (shown by the arrow head in FIG. 1); each coil unit 10 is overlapped with the adjacent coil units to enable the overlapping edge of the adjacent coil units to play the role of a decoupling capacitor. However, the solution of overlapping coil units as shown in FIG. 1 causes very complicated relationships among the coil units in the entire receiver coil array and it is difficult to determine the reasonable overlapping area between the coil units.

Therefore, the prior art further adopted a solution of using a decoupling capacitor in the receiver coil array. FIG. 2 is a schematic diagram illustrating the structure of a 2×3 receiver coil array using a decoupling capacitor. As shown in FIG. 2, taking a 2×3 receiver coil array as an example, each coil unit 10 in the receiver coil array shares a common side 21 with each of the adjacent coil units and each common side 21 has a capacitor 22 on it. Since coil unit 10 can be treated as a resonance circuit consisting of an inductor and capacitor, once the size of the coil unit 10 is determined, the inductance value of said coil unit 10 can be determined. At this point, regulation of the frequency and impedance of the coil unit 10 can be achieved by adjusting the value of the capacitor 22 on the common side 21 to reduce the effect of the coupling between the coil units on the frequency of the coil units. In which case, it is possible to adjust the value of the capacitor 22 by connecting a plurality of capacitors in series or in parallel. As with the solution shown in FIG. 1, there is a PCB 11 set on the non-common side of each coil unit 10 shown in FIG. 2 to regulate the frequency and impedance of the coil unit 10 and to amplify and output the magnetic resonance signals received by the coil unit 10 on which it is located (shown by the arrow head in FIG. 2).

The solution of using a decoupling capacitor does not complicate the relationship between the coil units in the receiver coil array and can reduce the effect of the coupling between the coil units on the frequency of these coil units. However, the solution is only applicable to a receiver coil array comprising only a small number of coil units.

FIG. 3 is a schematic diagram showing the structure of a 3×3 receiver coil array with a capacitor decoupling solution. As shown in FIG. 3, taking a 3×3 receiver coil array as an example, each coil unit in the receiver coil array shares a common side 21 with each of the adjacent coil units and each common side 21 has a capacitor 22 on it. There is a PCB 11 on the non-common side of the eight coil units 10 in the periphery (referred to as peripheral coil units) for regulating the frequency and impedance of the coil unit 10 and amplifying and outputting the magnetic resonance signals received by the coil unit on which it is located (shown by the arrow head in FIG. 3). All sides of the middle coil unit 30 surrounded by the eight peripheral coil units 10 are common sides 21 with the peripheral coil units 10 (the middle coil unit mentioned hereinafter means a coil unit, all sides of which are common sides), that is, all sides of the middle coil unit 30 are provided with a capacitor 22 for decoupling making it impossible to further install a PCB to regulate the frequency of said coil unit and the magnetic resonance signals received by the middle coil unit 30 cannot be outputted as well, or in other words, only the eight peripheral coil units 10 in the receiver coil array shown in FIG. 3 can output the received magnetic resonance signals.

It is evident that the prior art includes a greater number of coil units in the receiver coil array and when the aforementioned middle coil unit is included, it is impossible to regulate the frequency of the coil units and to output the magnetic resonance signals received by the coil units, and this is equivalent to reducing the number of coil units in the receiver coil array that are capable of receiving and outputting the magnetic resonance signals, hence the reduction in the quality of the signal received by the receiver coil array.

SUMMARY OF THE INVENTION

An object of the present invention is to provide a receiver coil array for use in the magnetic resonance imaging system and a magnetic resonance imaging system and can improve the quality of the signals received.

The present invention provides a receiver coil array, which is used in the magnetic resonance imaging system, having a middle coil unit and a number of peripheral coil units, wherein the peripheral coil units are arranged around the middle coil unit and share common sides with the middle coil unit, and a decoupling capacitor is set on the common sides. The receiver coil array further has an inductive coupling coil as the secondary coil of the middle coil unit, and the inductive coupling coil has an output regulation circuit that serves to regulate the frequency and impedance of the middle coil unit and output the signal received by the middle coil unit. The multiple peripheral coil units form a closed ring or a cross.

The middle coil unit is connected annularly in series to the decoupling capacitor and a first resistor, and the end of the decoupling capacitor connected to the first capacitor, is grounded The output regulation circuit includes a second capacitor and a third capacitor. The inductive coupling coil is connected annularly in series to the second capacitor and one end of the inductive coupling coil connects to the second capacitor and is grounded while the other end connects to one end of the third capacitor. The other end of the third capacitor serves as the output end of the output regulation circuit.

Further, the receiver coil array has a number of such middle coil units, each of which embodies an inductive coupling coil as described above.

The present invention further encompasses a magnetic resonance imaging system that includes the aforesaid receiver coil array.

The present invention incorporates an inductive coupling coil in the middle coil unit of the receiver coil array as its secondary coil, which serves to regulate the frequency and impedance of the middle coil unit, and said secondary coil has an output regulation circuit which can output the magnetic resonance signals received by the middle coil unit to increase the number of the coil units in the receiver coil array that receive and output resonance signals while further regulating the frequency and impedance of the middle coil. Since the present invention can achieve regulation of the frequency and impedance of the middle coil unit and increase the number of the coil units in the receiver coil array that receive and output the resonance signals, it can improve the quality of the signals received by the receiver coil array. Moreover, the technical solution of the present invention has a simple design and is easy to achieve.

DESCRIPTION OF THE PREFERRED EMBODIMENTS

Figure 1:
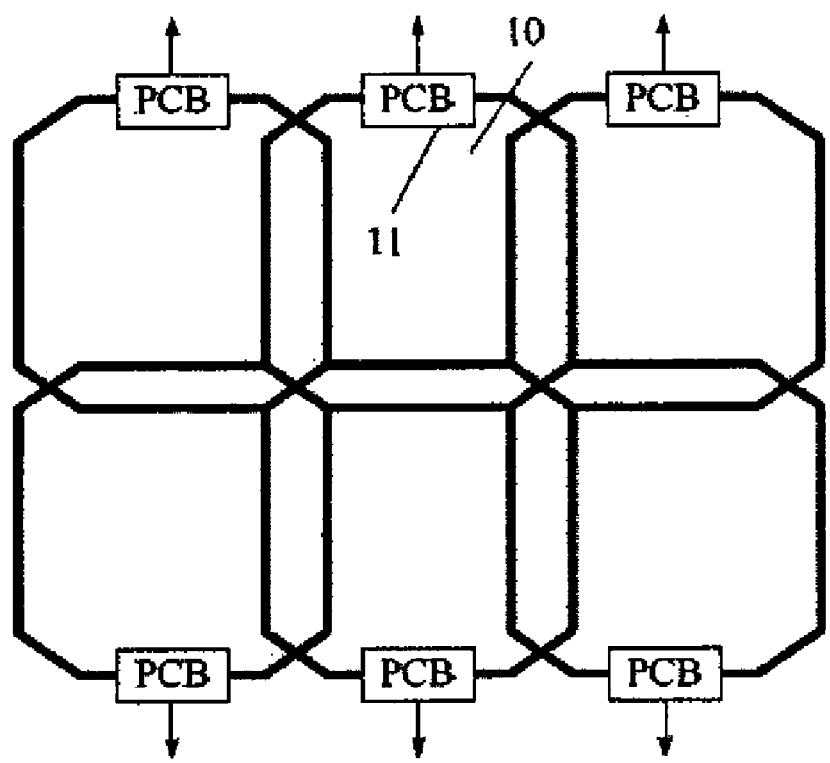
FIG. 1 is a schematic diagram showing the structure of a 2×3 receiver coil array using overlapping coil units.
Figure 2:
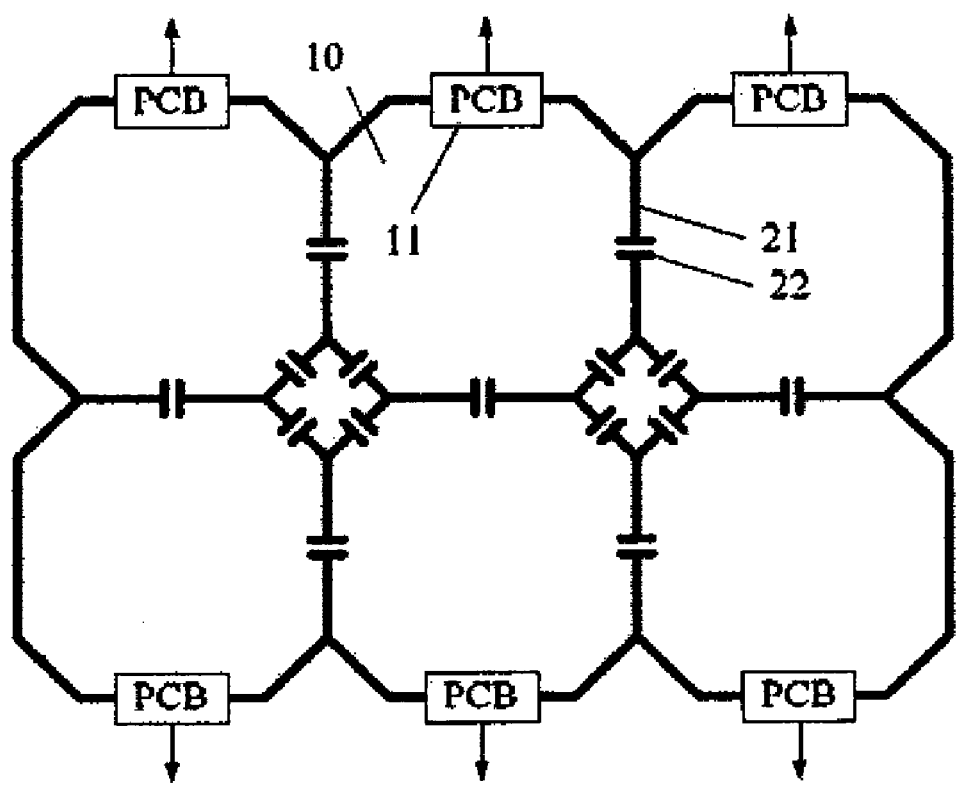
FIG. 2 is a schematic diagram showing the structure of a 2×3 receiver coil array using a decoupling capacitor.

In order to make the purposes, technical solutions and advantages of the present invention more evident and understandable, the present invention is further described in detail below by referring to the drawings and embodiments.

Figure 3:
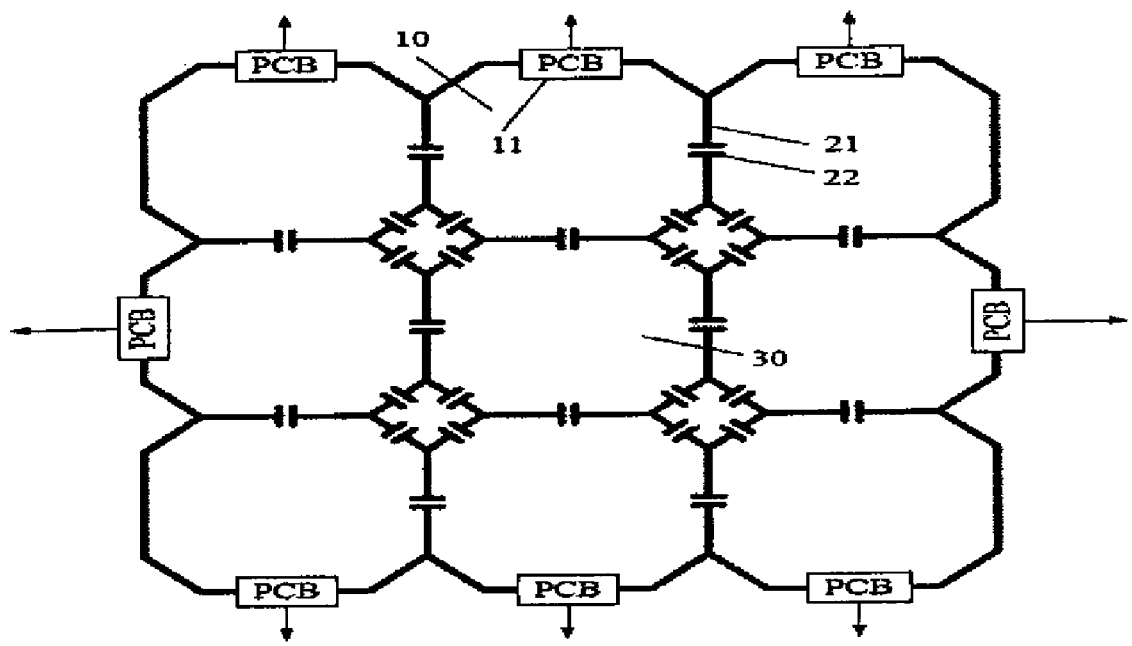
FIG. 3 is a schematic diagram showing the structure of a 3×3 receiver coil array using a decoupling capacitor.
Figure 4:
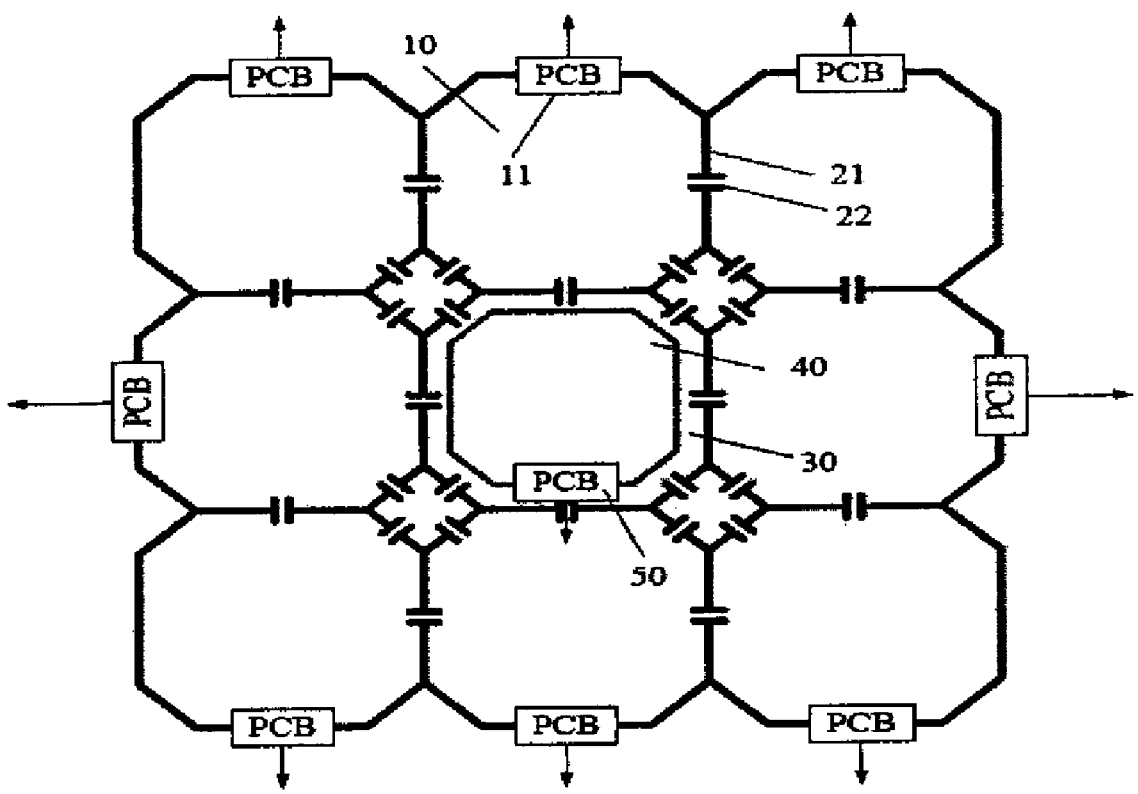
FIG. 4 is a schematic diagram showing the structure of a receiver coil array used in an embodiment of the present invention.

FIG. 4 shows the schematic diagram of a receiver coil array in an embodiment according to the present invention. Referring to FIG. 4, taking a 3×3 receiver coil array as an example, the receiver coil array in an embodiment according to the present invention still includes the middle coil unit 30 and eight peripheral coil units 10 as shown in FIG. 3, and the eight peripheral coil units 10 are arranged around the middle coil unit 30 and share common sides 21 with said middle coil unit 30. In this case, all of the eight peripheral coil units 10 surrounding the middle coil unit have a PCB 11, and each of the common sides 21 has a decoupling capacitor 22.

The difference lies in that the receiver coil array in the embodiment according to the invention further has an inductive coupling coil 40 which serves as the secondary coil of the middle coil unit 30. This makes it possible for the inductive coupling coil 40 to regulate the frequency and impedance of the middle coil unit 30.

Moreover, the inductive coupling coil 40, which serves as the secondary coil, further has a PCB 50, which serves as an output regulation circuit, to further regulate the frequency and impedance of the middle coil unit 30, and output the magnetic resonance signals received by the middle coil unit 30 (shown by the arrow head in FIG. 4).

As a result, in the receiver coil array as shown in FIG. 4, all of the nine coil units can output the magnetic resonance signals received, which increases the number of the coil units that can receive and output magnetic resonance signals as compared to the receiver coil array shown in FIG. 3.

It can be seen that this embodiment provides an inductive coupling coil 40 for the middle coil unit 30 of the receiver coil array as its secondary coil which serves to regulate the frequency and impedance of the middle coil unit 30, and the inductive coupling coil 40 has an output regulation circuit 50 which serves to output the magnetic resonance signals received by the middle coil unit 30 to increase the number of the coil units in the receiver coil array that receive and output magnetic resonance signals while further regulating the frequency and resistance of the middle coil unit 30. Since the aforesaid receiver coil array can regulate the frequency and impedance of its middle coil unit 30 and increase the number of the coil units that can receive and output magnetic resonance signals, it improves the quality of the signals received.

Moreover, the technical solution of the present invention has a simple design, eliminating the need to overlap the coil units as with the coil overlapping solution of the prior art shown in FIG. 1, and the need to determine the reasonable overlapping area through a complicated computing process, and therefore it can be easily achieved and applied.

Figure 5:
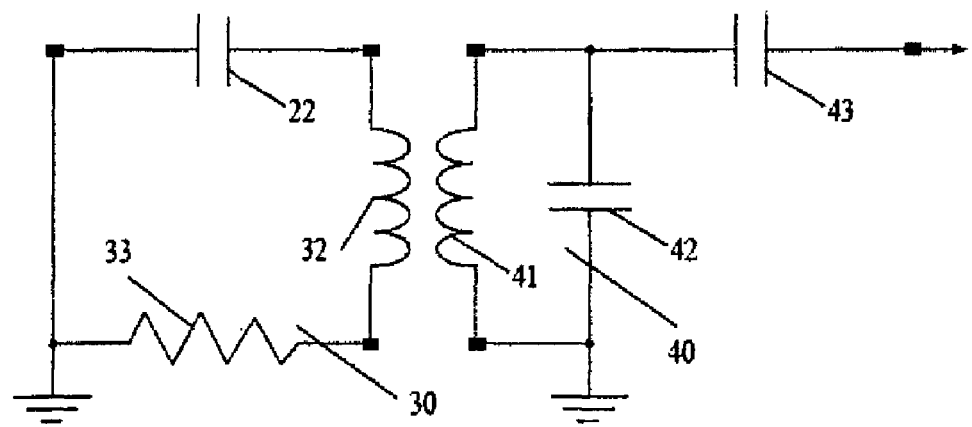
FIG. 5 is a schematic diagram showing the structure of the middle coil unit and its secondary coil in an embodiment of the receiver coil array according to the present invention.

Specifically, the middle coil unit 30 and the inductive coupling coil 40 of the receiver coil array in this embodiment have a structure equivalent to the wiring structure shown in FIG. 5.

Referring to FIG. 5, the middle coil unit 30 can be treated as the first inductor 32, which first inductor 32 is connected annularly in series to the decoupling capacitor 22 and the resistor 33, and the end of the decoupling 22, which connects to the resistor 33, is grounded.

The inductive coupling coil 40 can be treated as the second inductor 41, which second inductor 41 is connected annularly and in series to the second capacitor 42 on the PCB 50, and the end of the second capacitor 42, which connects to the second inductor 41, is grounded, and the other end is connected to one end of the third capacitor 43 on the PCB 50. The other end of the third capacitor 43 is the output end for the PCB 50.

In this way, once the size of the middle coil unit 30 is determined, the size of the first inductor 32 is also determined, and to regulate the frequency of the eight peripheral coil units 10, the size of the decoupling capacitor 22 is also determined. In the present embodiment, it is possible to regulate the degree to which the second inductor 41 couples with the first inductor 32 by adjusting the second inductor 41, and/or to regulate the frequency and impedance of the middle coil unit 30 by adjusting the sizes of the second capacitor 42 and the third capacitor 43.

Specifically, the degree to which the first inductor 32 couples with the second inductor 41 can be obtained by analysis using the work principle of a transformer. Supposing the impedance of the middle coil unit 30 which serves as the main coil is lower or higher than normal, it is possible to adjust sizes of the first inductor 32 and/or the second inductor 41 to change the degree to which the first inductor 32 couples with the second inductor 41, thereby regulating the real part of the impedance of the inductive coupling coil 40 as an equivalence to regulating the real part of the impedance of the middle coil unit 30. It is also possible to regulate the imaginary part of the impedance of the inductive coupling coil 40 by adjusting the size of the second capacitor 42 and this regulation is equivalent to regulating the imaginary part of the impedance of the middle coil unit 30. Furthermore, it is possible to regulate the frequency of the inductive coupling coil 40 by adjusting the size of the third capacitor 43, thereby regulating the output frequency of the signals received by the middle coil unit 30 from the inductive coupling coil 40.

The size of the second inductor 41 can be determined by the material, number of coil winds and size of the inductive coupling coil 40. Since the quality factor (Q) of the secondary coil does not affect the quality of the signals received by the primary coil, the secondary coil in this embodiment may be made of copper sheets of small width to reduce the cost and facilitate the fabrication.

Figure 6:
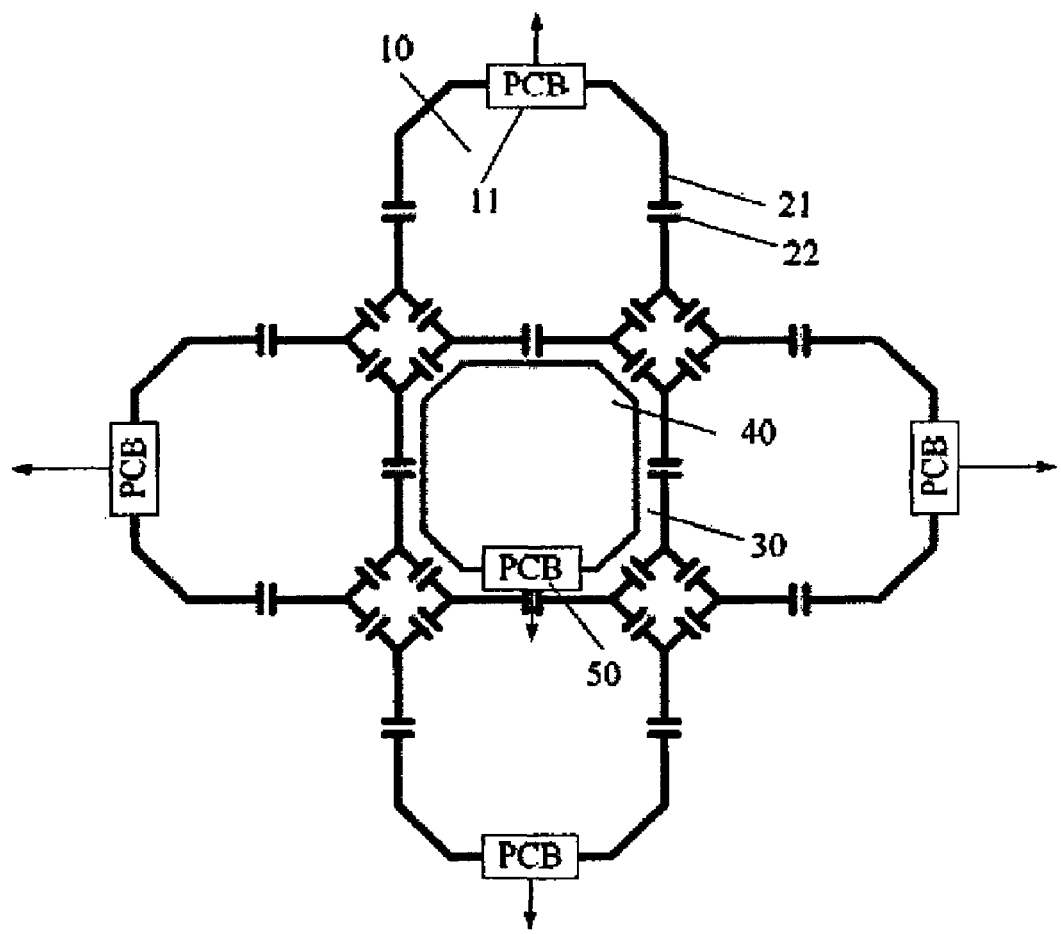
FIG. 6 is a schematic diagram showing the structure of another receiver coil array in another embodiment according to the present invention.

Practically, the peripheral coil units 10 surrounding the middle coil unit 30 that share common sides 21 with the middle coil unit 30 may not form a closed ring as shown in FIG. 4, but rather a cross shown in FIG. 6.

Figure 7:
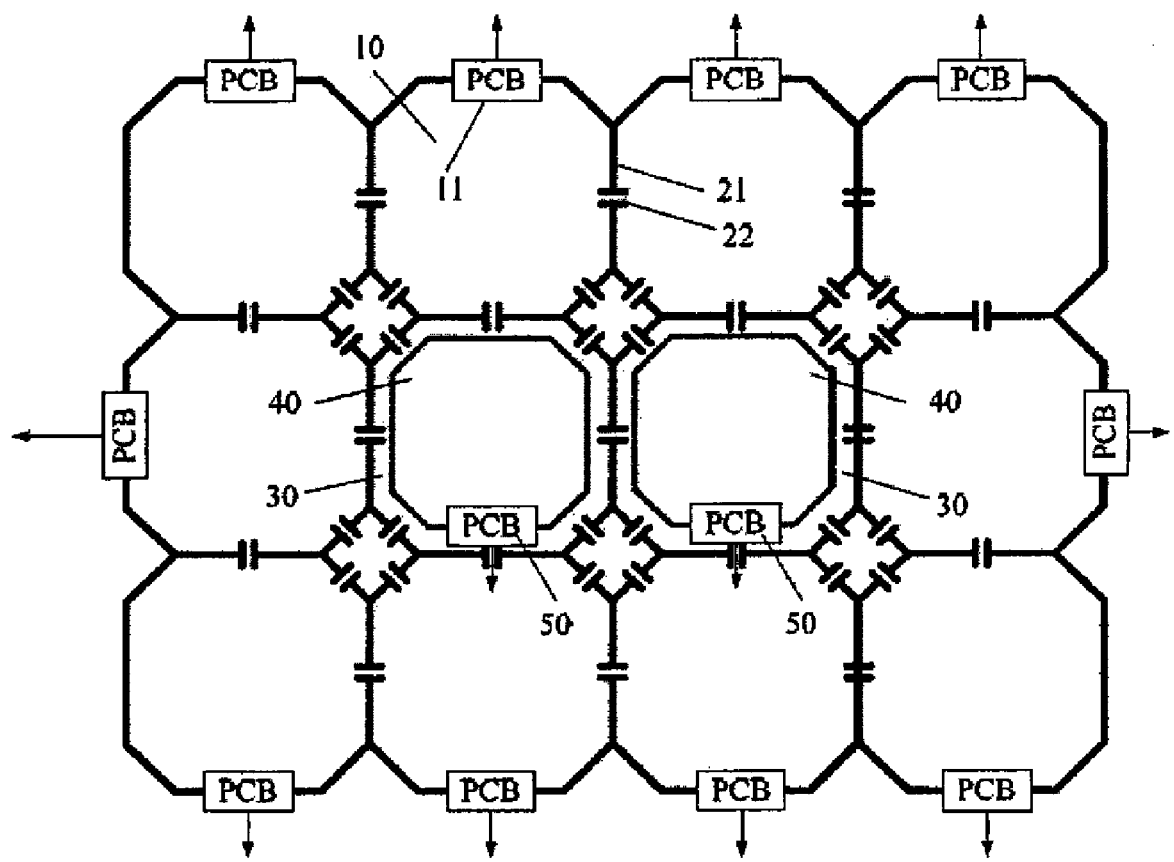
FIG. 7 is a schematic diagram showing the structure of yet another receiver coil array in an embodiment according to the present invention.

The number of the middle coil units 30 in the receiver coil array is not limited to one as shown in FIG. 4, but can be two as shown in FIG. 7 or more. If the receiver coil array has more than one middle coil unit 30, each of the middle coil units 30 can be provided with the aforesaid secondary coil 40.

In another embodiment according to the present invention, a magnetic resonance imaging system comprising the aforesaid receiver coil array is proposed.

The above only describes the preferred embodiments according to the present invention, and is not intended to limit the protective scope of the present invention. Any modifications, equivalent substitutions and improvements without departure from the spirit and principle of the present invention should fall within the protective scope of the present invention.

Although modifications and changes may be suggested by those skilled in the art, it is the intention of the inventors to embody within the patent warranted hereon all changes and modifications as reasonably and properly come within the scope of their contribution to the art.

We claim as our invention:

1. A receiver coil array for magnetic resonance imaging, comprising:
    a middle coil unit configured to receive magnetic resonance signals and operating, during reception of said magnetic resonance signals at a frequency and with an impedance;
    a plurality of peripheral coil units around said middle coil unit, each of said peripheral coil units sharing a common side with said middle coil unit, and each of said common sides having a decoupling capacitor connected therein; and
    an inductive coupling coil forming a secondary coil of said middle coil unit, said inductive coupling coil comprising an output regulation circuit that regulates the frequency and impedance of said middle coil unit and that emits, as an output, said magnetic resonance signals received by said middle coil unit.

2. A receiver coil array as claimed in claim 1 wherein each decoupling capacitor has opposite first and second ends, and a resistor connecting said first end to ground and said second end being connected directly to ground, said middle coil being annularly connected in series to the respective decoupling capacitors.

3. A receiver coil array as claimed in claim 2 wherein said output regulation circuit comprises a first output regulation circuit capacitor and a second output regulation circuit capacitor, and wherein said inductive coupling coil is connected annularly in series to said second capacitor, with one end of said inductive coupling coil being connected to ground through said second capacitor and an opposite end of said inductive coupling coil being connected to said second output regulation circuit capacitor, and an opposite end of said second output regulation circuit capacitor forming a circuit output of said output regulation circuit.

4. A receiver coil array as claimed in claim 3 wherein said middle coil unit is a first middle coil unit, and comprising a plurality of further middle coil units identical to said first middle coil unit.

5. A receiver coil array as claimed in claim 1 wherein said plurality of peripheral coil units form a closed ring.

6. A receiver coil array as claimed in claim 1 wherein said plurality of peripheral coil units form a cross.

* * * * *